United States Patent
Sten-Halvorsen

(10) Patent No.: US 8,084,979 B2
(45) Date of Patent: Dec. 27, 2011

(54) METHOD FOR TESTING AN ELECTRIC MOTOR

(75) Inventor: Vidar Sten-Halvorsen, Kongsberg (NO)

(73) Assignee: FMC Kongsberg Subsea AS, Kongsberg (NO)

( * ) Notice: Subject to any disclaimer, the term of this patent is extended or adjusted under 35 U.S.C. 154(b) by 967 days.

(21) Appl. No.: 11/065,226

(22) Filed: Feb. 23, 2005

(65) Prior Publication Data

US 2005/0204803 A1    Sep. 22, 2005

(30) Foreign Application Priority Data

Feb. 23, 2004 (NO) .................................. 20040780

(51) Int. Cl.
*G05B 5/00* (2006.01)
(52) U.S. Cl. ........ 318/469; 318/470; 318/471; 318/472; 318/473; 318/474
(58) Field of Classification Search .................. 318/469, 318/470, 471, 472, 473, 474; 137/47, 58
See application file for complete search history.

(56) References Cited

U.S. PATENT DOCUMENTS

| 4,099,704 | A | * | 7/1978 | Okumura et al. | 251/129.12 |
| 4,712,071 | A | * | 12/1987 | Charbonneau et al. | 324/415 |
| RE32,579 | E | * | 1/1988 | Harvey et al. | 318/434 |
| 4,816,987 | A | * | 3/1989 | Brooks et al. | 700/45 |
| 4,980,622 | A | * | 12/1990 | Grant et al. | 318/286 |
| 5,433,245 | A | * | 7/1995 | Prather et al. | 137/554 |
| 5,483,841 | A | | 1/1996 | Casada | |
| 5,950,147 | A | * | 9/1999 | Sarangapani et al. | 702/179 |
| 6,595,487 | B2 | * | 7/2003 | Johansen et al. | 251/129.04 |

FOREIGN PATENT DOCUMENTS

JP    11248030 A    9/1999

* cited by examiner

*Primary Examiner* — Walter Benson
*Assistant Examiner* — David Luo

(57) ABSTRACT

A method for testing an electric motor which is connected to a valve element by at least one component comprises starting the motor, measuring a movement parameter of at least one of the motor and the component without moving the valve element, and stopping the motor when the measured movement parameter indicates that the valve element is about to move.

18 Claims, 3 Drawing Sheets

METHOD FOR TESTING AN ELECTRIC MOTOR

BACKGROUND OF THE INVENTION

The present invention relates to a method for testing an electric motor which is used to, for example, actuate a subsea valve. More specifically, the invention relates to a method for testing the operability of such a motor without actuating the valve.

Subsea installations often include a number of valves for controlling the flow of fluids through certain of their components. These subsea valves are normally hydraulically actuated, since hydraulic actuators are traditionally regarded as being fairly reliable. However, current hydraulic actuators are practically limited in the depths at which they can be used. In contrast, electric actuators are not so limited. Thus, by replacing current hydraulic actuators with electric actuators, such as electric motors, subsea installations can be located at greater depths and can thus potentially experience large cost savings. However, while electric actuators are common in many industries, they are not often used in subsea installations. This is due mainly to reliability concerns, since a failure of a subsea valve can potentially lead to environmental disasters.

Hydraulically actuated subsea valves are normally tested by opening and closing the valves. To do this the subsea installation must be shut down; but since these valves are usually only tested once per year, this is not regarded as a problem. The hydraulic actuators themselves are not specifically tested since they are regarded as very reliable.

However, electric actuators do need to be tested since their electric motors are considered to be less reliable than hydraulic actuators. Due to these reliability concerns, an operator may desire to test the electric motors relatively frequently to ensure that they will perform as intended. Therefore, the testing of the electric motors should ideally not affect the valves to which they are connected to avoid having to shut down the subsea installation.

SUMMARY OF THE INVENTION

In accordance with the present invention, these and other limitations in the prior art are overcome by providing a method for testing an electric motor which is connected to a valve element by at least one component. The method comprises the steps of starting the motor and measuring a movement parameter of at least one of the motor and the component without moving the valve element. In a further embodiment, the method comprises the additional step of stopping the motor when the measured movement parameter indicates that the valve element is about to move.

In accordance with another embodiment of the invention, the method comprises determining a value for the movement parameter which corresponds to a movement of the valve element, comparing the measured movement parameter with the value, and stopping the motor when the measured movement parameter is approximately equal to this value.

In an exemplary embodiment of the invention, the movement parameter comprises a number of turns of the motor. In addition, the value comprises an approximate number of turns the motor can make before the valve element begins to move. Furthermore, the comparing and stopping steps of this embodiment comprise comparing the measured number of turns of the motor with the predetermined number of turns the motor can make before the valve element begins to move, and stopping the motor when the measured number of turns is approximately equal to the predetermined number of turns.

The method of the present invention utilizes a well-known feature of mechanical transmissions, namely, that a certain amount of play exists due to tolerance differences between the interacting mechanical parts of the transmissions. Thus, the motor can be run within this area of play without moving the valve element. Therefore, the motor can be tested without the need to shut down the subsea installation.

These and other objects and advantages of the present invention will be made apparent from the following detailed description, with reference to the accompanying drawings.

DETAILED DESCRIPTION OF THE PREFERRED EMBODIMENTS

Figure 1:
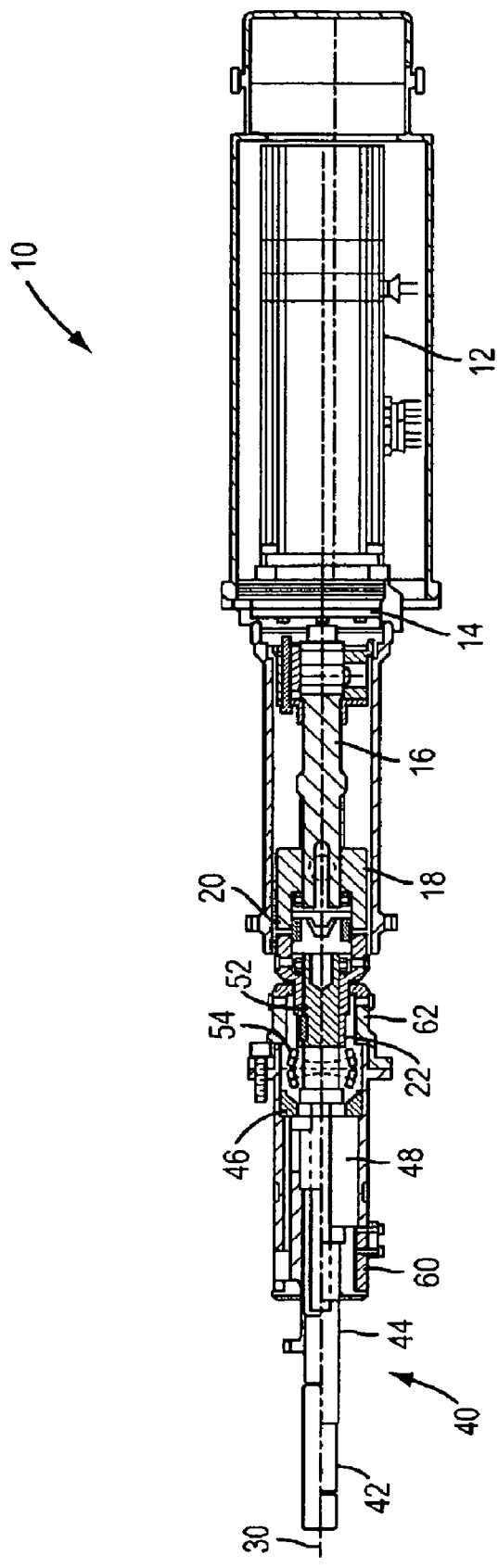
FIG. 1 is a simplified cross-sectional view of an exemplary electric actuator with which the method of the present invention may be used.

Referring to FIG. 1, an exemplary electric actuator 10 is shown which includes an electric motor 12 that may be tested by the method of the present invention. The actuator 10 is normally placed in an oil-filled enclosure, but this enclosure has been omitted from FIG. 1 for better clarity. The actuator 10 comprises the electric motor 12, a gearbox 14 which is connected to an output shaft of the motor, and a drive shaft 16 which is rotated by the gearbox. In the exemplary actuator 10 shown in FIG. 1, the drive shaft 16 is connected to a flexible joint 18 which includes a part 20 that allows the actuator 10 to bend or flex somewhat under load. The distal end of the joint 18 includes a sleeve 22 which comprises an inner surface that is hexagonal in cross section.

The motor 12 comprises a housing which encloses the electric windings and is normally filled with a silicon oil or other suitable dielectric fluid. In one embodiment of the invention, the motor 12 is a brushless type DC motor and the gearbox is a planetary gear which has a relatively large gear ratio, such as 50:1 or 60:1. In addition, the actuator 10 also includes conventional drive electronics (not shown) for receiving control signals and electric power.

Referring still to FIG. 1, the actuator 10 is shown engaging an exemplary subsea valve 40. The valve 40 is normally attached to a subsea installation 60, such as a subsea Christmas tree, portions of which have been omitted for clarity. The subsea installation 60 may include an ROV panel 62 to facilitate the engagement of the actuator 10 with the valve 40.

The valve 40 shown in FIG. 1 is a linear-type valve, such as a conventional gate valve which includes a valve element 42 that is attached to a valve spindle 44. In FIG. 1, portions of the valve 40 are split along its longitudinal axis 30 to show the valve in both its fully open and fully closed positions. The proximal end 46 of the valve spindle 44 is threaded over part of its length, and these threads are engaged by a rotary bushing 48 to thereby form a rotary-to-linear motion converter.

Such converters are well known in the art and therefore need not be described further. The bushing 48 is attached to a hexagonal bolt 52 which is rotatably supported in a bearing 54 and is received in the sleeve 22. Thus, when the motor 12 is activated, it will rotate the sleeve 22 and the bolt 52, and the rotary bushing 48 will convert this rotation into linear movement of the valve spindle 44, as is well known in the art.

The ROV panel 62 and the bolt 52 preferably comprise a standard API interface. In addition, the actuator 10 is housed in a removable unit so that, in an emergency, the actuator may be removed from the standard API interface and the valve 40 may be actuated directly with an ROV tool.

When the motor 12 is activated, the valve element 42 will not move immediately due to the play in the mechanical parts of the actuator 10 and the valve 40 which must first be overcome. Two main mechanical parts contribute to this play: the gearbox 14 and the rotary bushing 48. The motor 12 will therefore rotate a number of times before the valve element 42 starts to move. In accordance with the present invention, this play is used to test the motor 12 without actuating the valve 40.

Figure 2:
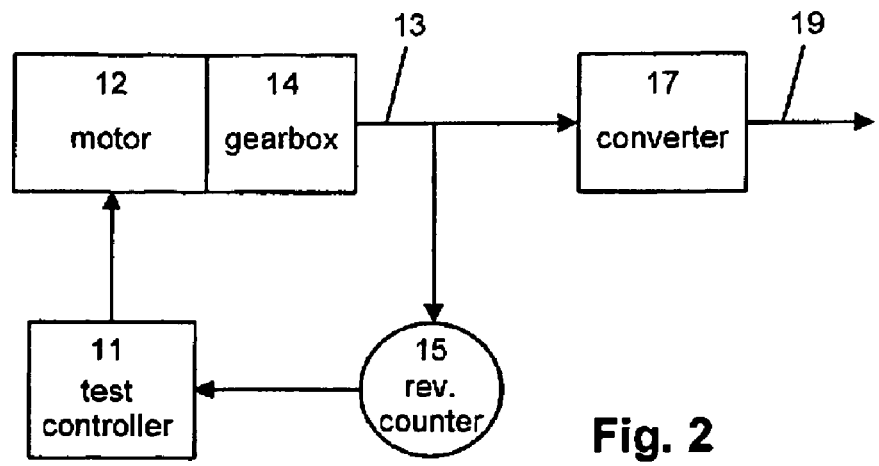
FIG. 2 is a schematic block diagram illustrating a first embodiment of the invention.

FIG. 2 schematically illustrates a first embodiment of the invention. As discussed above, activation of the motor 12 will result in a rotational movement 13 of the drive shaft 16. This rotational movement 13 in is turn converted to a linear movement 19 of the valve spindle 44 by a converter 17, which includes the rotary bushing 48 and the threaded end 46 of the valve spindle.

In accordance with the present invention, a movement parameter is measured in order to provide an indication that the valve spindle 44 is about to move. In the embodiment of the invention which is illustrated in FIG. 2, for example, this movement parameter is provided by a conventional revolution counter 15, which may be used to measure the number of turns of either the motor 12 or the drive shaft 16. Thus, the invention ideally also includes a suitable test controller 11 which is designed to start the motor 12 in order to initiate the test and to stop the motor when the measured number of turns, as determined by the revolution counter 15, exceeds a predetermined number of turns. The predetermined number of turns is preferably dependent on the gearbox ratio and may be determined in a laboratory test before installation of the actuator 10.

Figure 5:
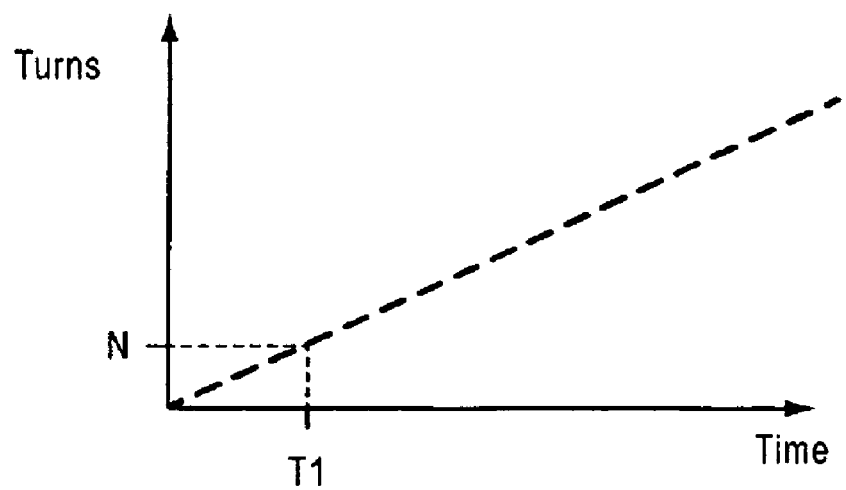
FIG. 5 is a graph illustrating certain parameters of the operation of the invention depicted in FIG. 2.

A graph illustrating the number of turns of the motor 12 with respect to time is shown in FIG. 5. When the motor 12 is first activated, it will rotate an initial number of turns N to take up the play in the mechanical parts. This number of turns is completed in the time indicated by T1. From this point the valve element 42 will start to move and the motor 12 will continue to rotate until the valve 40 has reached its end position (open or closed). The high ratio gearbox 14 requires that the motor 12 make a relatively large number of turns to actuate the valve 40, and hence a significant number of turns N before the valve spindle 44 will start to move. Before installing the motor 12, it may be tested in a laboratory to determine the number of turns N which it can make before the valve element 42 begins to move. This information can be used during a test of the motor 12 by only running the motor the predetermined number of turns N or alternatively, the corresponding time T1. The number of turns which the motor 12 makes during this test can be measured using the revolution counter 15.

Figure 3:
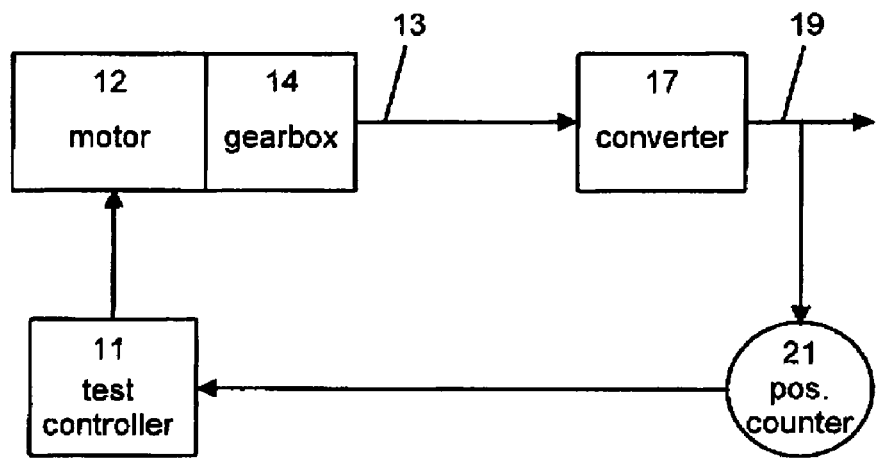
FIG. 3 is a schematic block diagram illustrating a second embodiment of the invention.

A second embodiment of the invention is schematically illustrated in FIG. 3. This embodiment is similar to the embodiment described with reference to FIG. 2, except that the movement parameter is provided by a conventional position detector 21 rather than by the revolution counter 15. The position detector 21 is arranged to measure the linear position of the valve spindle 44. Furthermore, the test controller 11 is designed to stop the motor 12 when the position detector 21 indicates that the valve spindle 44 has moved a preset distance, which in turn indicates that the play has been taken up and the valve element 42 is about to move.

Figure 6:
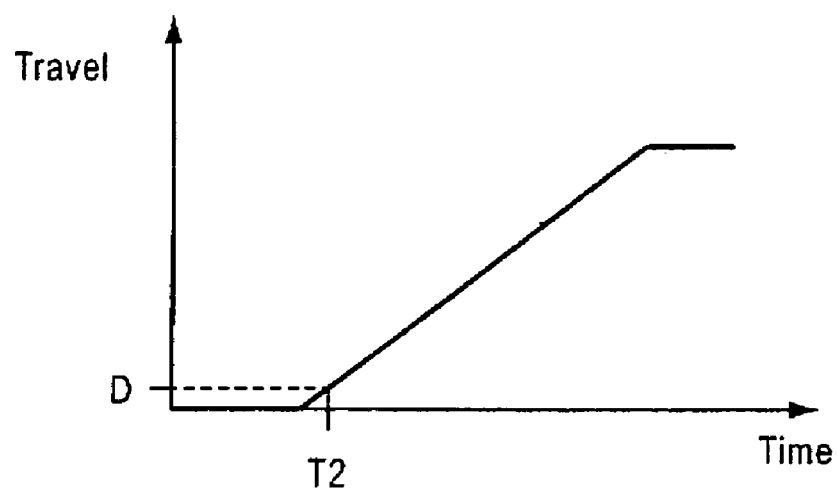
FIG. 6 is a graph illustrating certain parameters of the operation of the invention depicted in FIG. 3.

A graph illustrating the travel of the valve spindle 44 with respect to time is shown in FIG. 6. As discussed above, the valve spindle 44 will not start to move until the play in the actuator 10 has been taken up. The movement of the valve spindle 44 can be measured using the position detector 21. As shown in FIG. 6, the position detector 21 will not register movement of the valve spindle 44 for the first few seconds, corresponding to an elapsed time T2, until the position D is reached. From that point it will register a steady movement of the valve spindle 44 until the valve 40 reaches its end position (open or closed).

Figure 4:
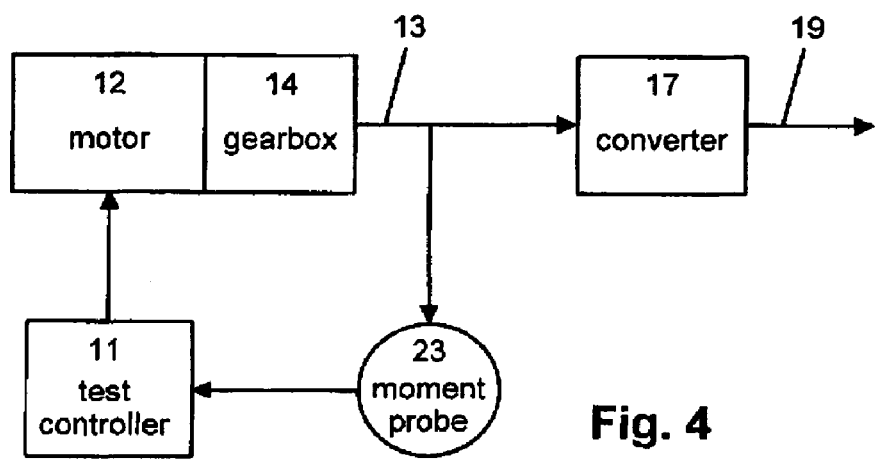
FIG. 4 is a schematic block diagram illustrating a third embodiment of the invention.

A third embodiment of the invention is schematically illustrated in FIG. 4. This embodiment is similar to the embodiment described with reference to FIG. 2, except that the movement parameter is provided by a conventional moment probe 23 rather than by the revolution counter 15. The moment probe 23 is arranged to measure the moment on the motor 12. Furthermore, the test controller 11 is designed to stop the motor 12 when the moment probe 23 indicates that this moment exceeds a preset load, which in turn indicates that the play has been taken up and the valve element 42 is about to move.

Figure 7:
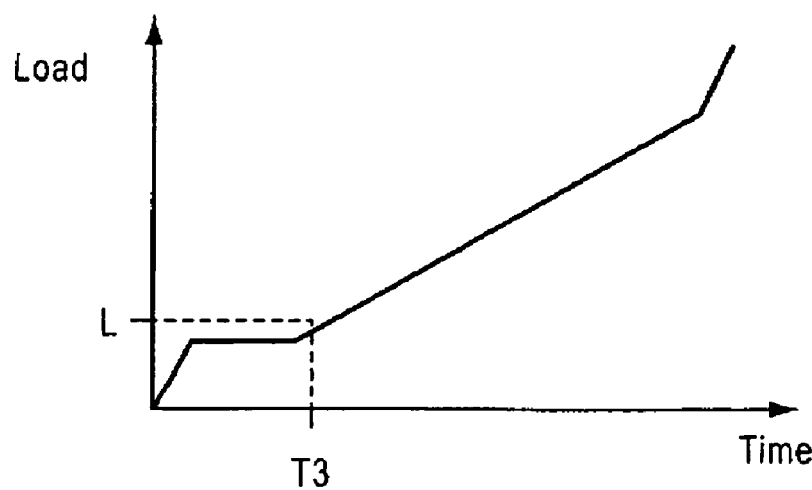
FIG. 7 is a graph illustrating certain parameters of the operation of the invention depicted in FIG. 4.

A graph illustrating the measured moment on the motor 12 with respect to time is shown in FIG. 7. As explained above, the third embodiment of the invention uses a moment probe 23 to measure the moment on the motor 12. When the motor 12 is first activated, a small moment load will initially be measured due to the motor moving the gearbox 14 and drive shaft 16. When the valve 40 starts to move, a peak will occur in this load. After the valve 40 has started moving, the load will level off or even decrease until the valve reaches its end position (open or closed). The load will then increase again. This last increase in the load may be employed to signal an end position of the valve 40 and stop the motor 12 so that it does not burn out due to overload. When the moment exceeds the preset load L, corresponding to the time T3, this indicates that the play has been taken up and the valve element 42 is about to move.

The results of the movement parameters measured by the revolution counter 15, the position detector 21 or the moment probe 23 may be transmitted to and stored in a central processor which is housed in a subsea control module. In this regard, the operation of the central processor corresponds to the test controller 11 which is schematically illustrated in FIGS. 2 through 4.

Furthermore, the test of the motor 12 can be conducted at regular intervals without human intervention since the procedure can be stored as a routine in the central processor or the test controller 11.

It should be recognized that, while the present invention has been described in relation to the preferred embodiments thereof, those skilled in the art may develop a wide variation of structural and operational details without departing from the principles of the invention. Therefore, the appended claims are to be construed to cover all equivalents falling within the true scope and spirit of the invention.

What is claimed is:

1. A method for testing an electric motor which is connected to a valve element by at least one component, the method comprising:

starting the motor;

measuring a movement parameter of at least one of the motor and the component without moving the valve element; and stopping the motor when the measured movement parameter indicates that the valve element is about to move.

2. The method of claim 1, further comprising:

determining a value for the movement parameter which corresponds to a movement of the valve element;

comparing the measured movement parameter with the value; and stopping the motor when the measured movement parameter is approximately equal to the value.

3. The method of claim 2, wherein the movement parameter comprises a number of turns of the motor.

4. The method of claim 3, wherein the value comprises an approximate number of turns the motor makes before the valve element begins to move.

5. The method of claim 4, wherein the comparing and stopping steps comprise:

comparing the measured number of turns of the motor with the predetermined number of turns the motor makes before the valve element begins to move; and stopping the motor when the measured number of turns is approximately equal to the predetermined number of turns.

6. The method of claim 4, wherein the at least one component also comprises a gearbox which is connected between the motor and the valve element, and wherein the value depends on the gearbox ratio of the gearbox.

7. The method of claim 2, wherein the at least one component comprises a drive shaft and the movement parameter comprises a number of turns of the drive shaft.

8. The method of claim 7, wherein the value comprises an approximate number of turns the drive shaft makes before the valve element begins to move.

9. The method of claim 8, wherein the comparing and stopping steps comprise:

comparing the measured number of turns of the drive shaft with the predetermined number of turns the drive shaft makes before the valve element begins to move; and stopping the motor when the measured number of turns is approximately equal to the predetermined number of turns.

10. The method of claim 2, wherein the at least one component comprises a valve spindle and the movement parameter comprises a linear position of the valve spindle.

11. The method of claim 10, wherein the value comprises an approximate distance the valve spindle can travel before the valve element begins to move.

12. The method of claim 11, wherein the comparing and stopping steps comprise:

comparing the measured distance of the valve spindle with the predetermined distance the valve spindle can travel before the valve element begins to move; and stopping the motor when the measured distance is approximately equal to the predetermined distance.

13. The method of claim 2, wherein the at least one component comprises a valve spindle and the movement parameter comprises a linear movement of the valve spindle.

14. The method of claim 13, wherein the value comprises a steady movement of the valve spindle.

15. The method of claim 14, wherein the comparing and stopping steps comprise:

comparing the linear movement of the valve spindle with the steady movement; and stopping the motor when the measured linear movement is approximately equal to the steady movement.

16. The method of claim 2, wherein the movement parameter comprises a moment on the motor.

17. The method of claim 16, wherein the value comprises an approximate moment on the motor when the valve element begins to move.

18. The method of claim 17, wherein the comparing and stopping steps comprise:

comparing the measured moment on the motor with the predetermined moment on the motor when the valve begins to move; and stopping the motor when the measured moment is approximately equal to the predetermined moment.

* * * * *